(12) United States Patent
Reese et al.

(10) Patent No.: US 8,705,258 B2
(45) Date of Patent: Apr. 22, 2014

(54) COMBINED POWER SWITCH AND DATA DISTRIBUTION UNIT

(71) Applicant: Production Resource Group L.L.C, New Windsor, NY (US)

(72) Inventors: Charles Reese, Grapevine, TX (US); Rusty Brutsche, Dallas, TX (US); James Bornhorst, De Soto, TX (US)

(73) Assignee: Production Resource Group, LLC, New Windsor, NY (US)

( * ) Notice: Subject to any disclaimer, the term of this patent is extended or adjusted under 35 U.S.C. 154(b) by 0 days.

(21) Appl. No.: 13/863,535

(22) Filed: Apr. 16, 2013

(65) Prior Publication Data

US 2013/0300197 A1    Nov. 14, 2013

Related U.S. Application Data

(63) Continuation of application No. 11/958,308, filed on Dec. 17, 2007, now Pat. No. 8,421,268.

(60) Provisional application No. 60/871,109, filed on Dec. 20, 2006.

(51) Int. Cl.
*H02M 1/10* (2006.01)
*H02M 1/00* (2007.01)

(52) U.S. Cl.
USPC .......................................... 363/142; 363/144

(58) Field of Classification Search
USPC .......................... 363/142, 144, 146; 307/1, 38
See application file for complete search history.

(56) References Cited

U.S. PATENT DOCUMENTS

| | | | |
|---|---|---|---|
| 6,761,470 B2 * | 7/2004 | Sid ................................. | 362/233 |
| 7,889,051 B1 * | 2/2011 | Billig et al. .................. | 340/5.23 |
| 7,940,673 B2 * | 5/2011 | Ballard et al. ................ | 370/241 |
| 7,961,075 B2 * | 6/2011 | Kuenzler et al. ............. | 340/3.52 |
| 8,053,993 B2 * | 11/2011 | Brockmann .................. | 315/149 |
| 8,214,061 B2 * | 7/2012 | Westrick et al. .................. | 700/9 |
| 2006/0044117 A1 | 3/2006 | Farkas et al. | |
| 2006/0163945 A1 | 7/2006 | Bornhorst et al. | |
| 2006/0170376 A1 | 8/2006 | Piepgras et al. | |

* cited by examiner

*Primary Examiner* — Adolf Berhane
*Assistant Examiner* — Emily P Pham
(74) *Attorney, Agent, or Firm* — Law Office of Scott C. Harris, Inc.

(57) ABSTRACT

A communication device for use with a power distribution module. The communication device allows multiple different DMX universes to be handled over the same cable that also handles power distribution. A front of house module is provided for powering consoles and receiving DMX inputs from the consoles. Two different consoles can be powered and provide their inputs, and either console can be used to control any or all of the universes.

16 Claims, 13 Drawing Sheets

```
        I/O SUMMARY      A
   Rack101        001a 002b

TrunkA      TrunkB
     003 004     005 006
     in    out   src:a    >
```

FIG 13A

```
        I/O Summary      A
   Rack101           000a 001a
       002b 003b 004b 005b
       006c 007c 008c 009c
   Output     000  001
   in    out    src:a      >
```

FIG 13B

```
     System Overview      A
  Univ:        0   0   0
   Rack I/F:   0
    FOH I/F:   0 univ    rack    foh    exit
```

FIG 13G

```
     System: Universes    A
  000b        Rack250       p0

<-    ->            exit
```

FIG 13H

COMBINED POWER SWITCH AND DATA DISTRIBUTION UNIT

This application is a continuation application of U.S. Ser. No. 11/958,308 filed Dec. 17, 2007, now U.S. Pat. No. 8,421,268 issued Apr. 16, 2013, which claims priority from Provisional Application No. 60/871,109, filed Dec. 20, 2006, the disclosure of which is herewith incorporated by reference in their entirety.

BACKGROUND

Our previous application Ser. No. 11/190,494 filed Jul. 27, 2006, is formed of a rolling rack which holder breaker modules that provide power that is sent over a cable to breakout boxes. The same rack can handle many different kinds of power, e.g., 115 and 220, as well as multiple different phases etc. The safety systems in the rack prevent the wrong voltage from being applied to the breakout boxes. An interlock system only supplies power after all connections are made, thereby protecting workers against being shocked during installation.

FIG. 1 illustrates the rack 100 and the previous components. LED meter module 102 may monitor the state of the different communication channels. Breaker modules such as 104 may also be used. Each of the breaker modules such as 104 provides power when it is appropriately connected to an appropriate breakout box 110. The controls within the unit will not allow power to be applied unless the proper power is configured for the proper breakout box.

SUMMARY

The present application describes a special communication system added to the power switch.

BRIEF DESCRIPTION OF THE DRAWINGS

FIGS. 13A-13I show different menus.

DETAILED DESCRIPTION

Figure 1:
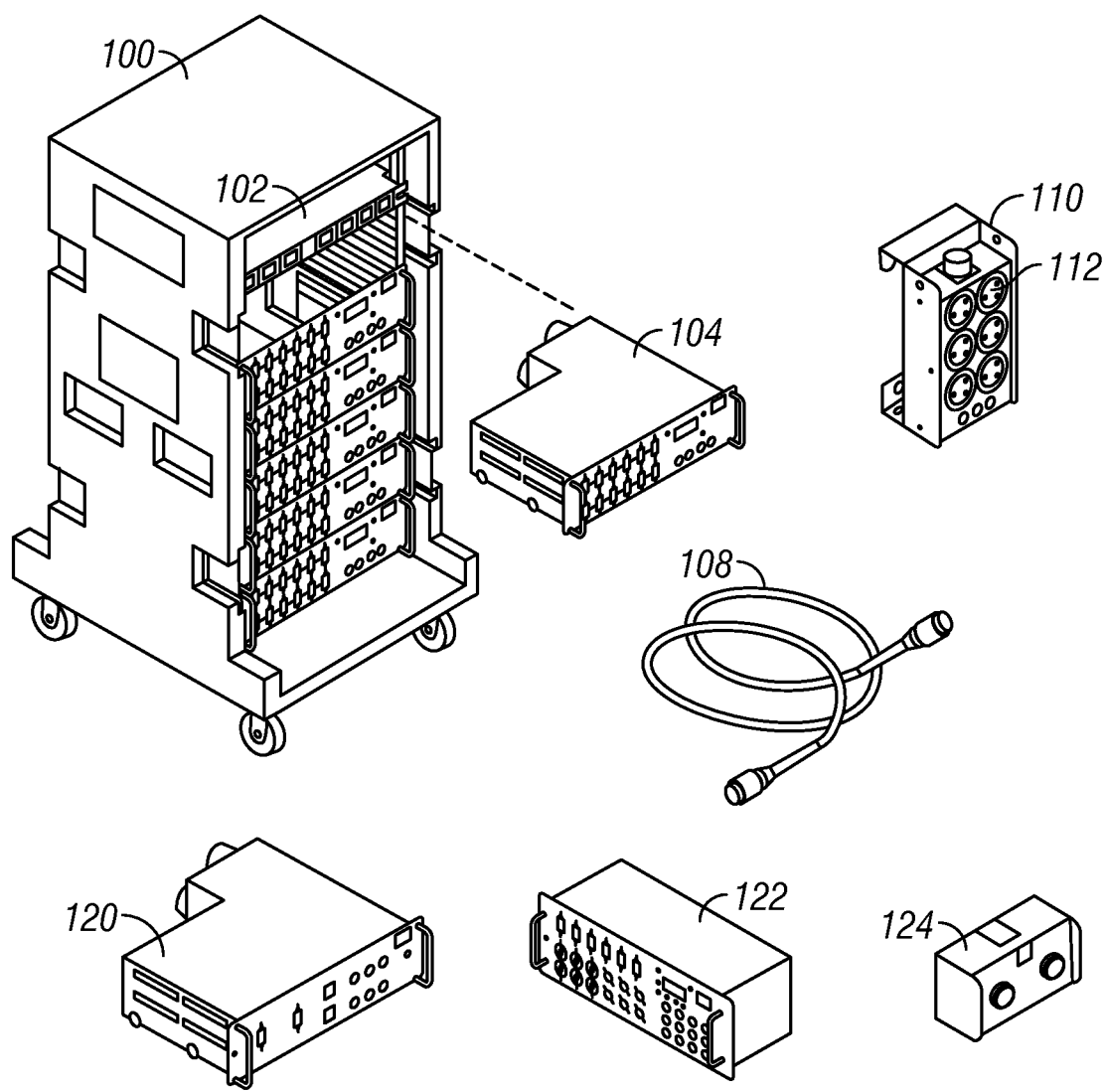
FIG. 1 shows a block diagram of a system.

A breaker module such as 104 is connected via a trunk cable 108 to a breakout box. Each breakout box such as 110 includes a number of outlets 112 thereon. The outlets 112 are configured for a certain kind of power. Power is only supplied through the trunk cable 100 when an appropriate breakout box for the outlets is properly attached. That is, if the outlets such as 112 are configured to supply 115 V power, e.g., they have the form and layout of a 115 V power socket, then power will only be supplied when 115 V is available on the trunk cable 108. The operation of this system is also described in our co-pending application, described above.

In addition, FIG. 1 shows front of house breaker module 120, which is connected to a front of house breakout module 122. Part of the communication is carried out over DMX, and hence there may be multiple different DMX "universes" carried over the cables. A front of house AV switch 124 allows selecting between different sets of universes using a simplified technique. In operation, there may be eight DMX 512 universes along with inputs for Ethernet signal at the breakout module. There may also be fewer universes, for example, the embodiment describes 3 DMX universes.

Figure 2:
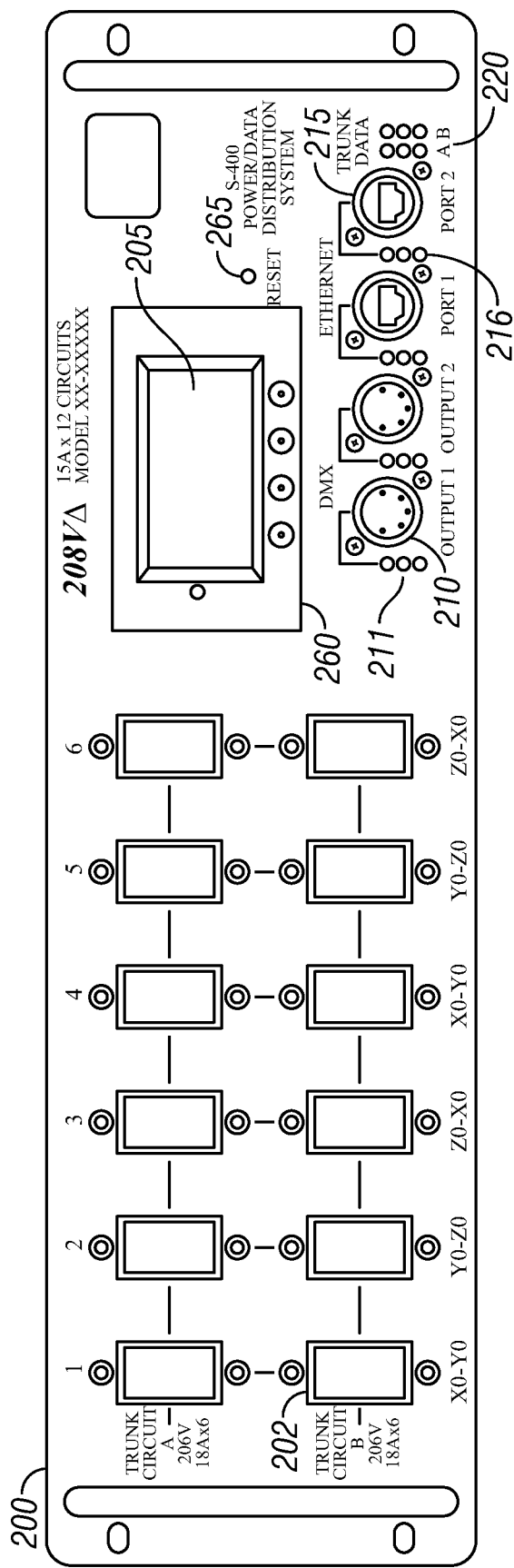
FIG. 2 shows a breaker module.

FIG. 2 illustrates the front actual breaker modules. The panel 200 includes a number of circuit breaker switches 202. Each breaker switch 202 provides individual protection for a circuit. There may be two separate trunk circuits on the panel, and six breakers per trunk circuit. A main display 205 may show information about the configuration.

In addition, each breaker module may include connections for multiple different DMX channels 210, and multiple different Ethernet ports 215. Each of these data channels also includes at least one status indicator. In this embodiment, the DMX channel 210 includes LEDs 211 that indicate valid DMX receive, RDM receive, and transmit. The Ethernet connectors 215 have associated LEDs 216 which indicate Ethernet link, transmit and receive.

There are also separate trunk LEDs 220 that indicate valid trunk data link and data flow.

Figure 3:
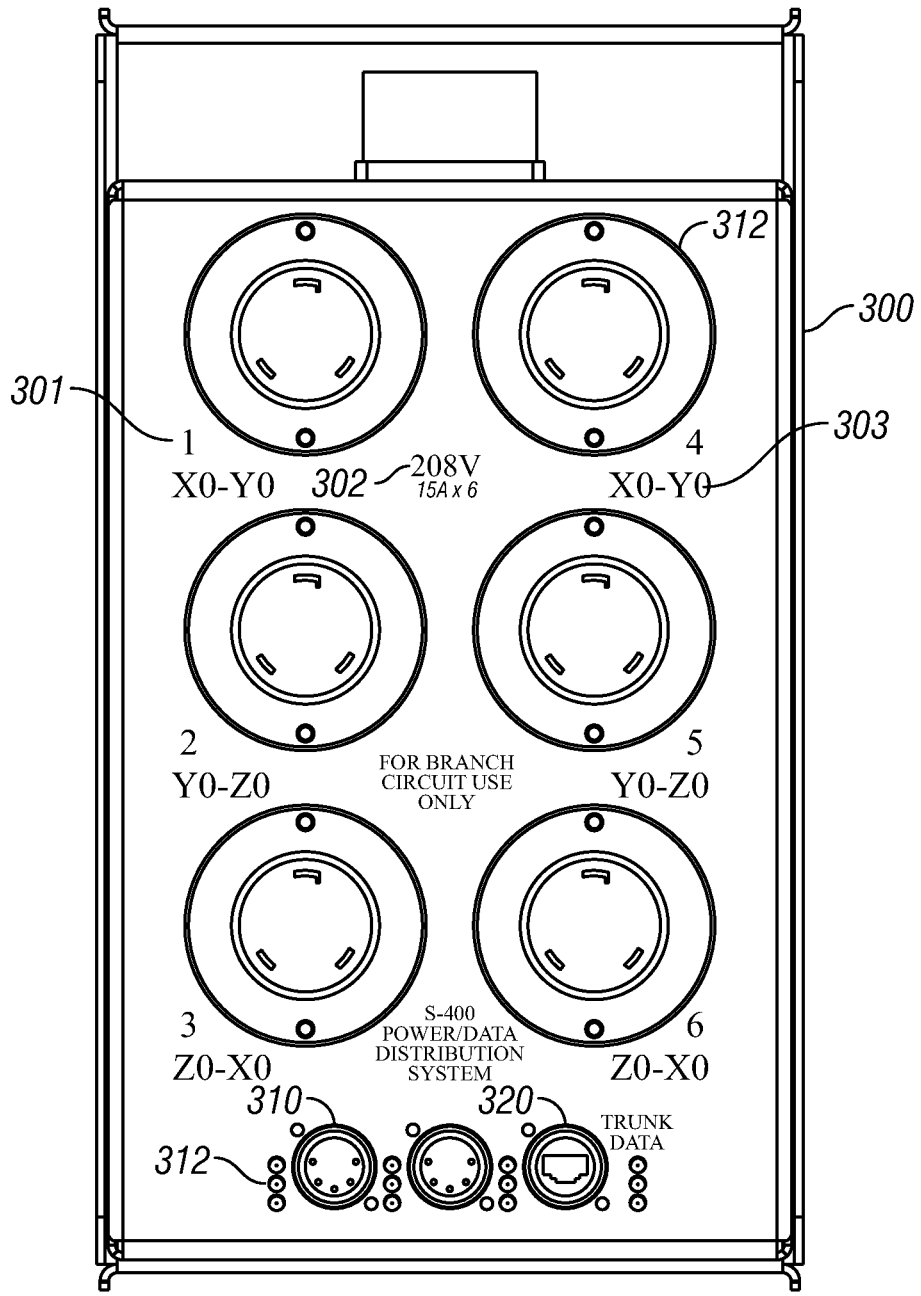
FIG. 3 shows a breakout box with communication parts.

FIG. 3 shows details of the breakout box 300. Each breakout box includes a number of power output connectors such as 300 can provide AC power to a device, and as previously described, no AC power is provided until the proper kind of connection has been made. In addition, each breakout box provides, as in the breaker modules, DMX connectors from multiple universes, Ethernet connectors, and status indicators.

FIG. 3 shows a 15A 208 V model with six outlets. Each breakout box 300 is labeled with a connector number such as 301, and voltage specification 302 and phase specification 303 as shown.

Figure 4:
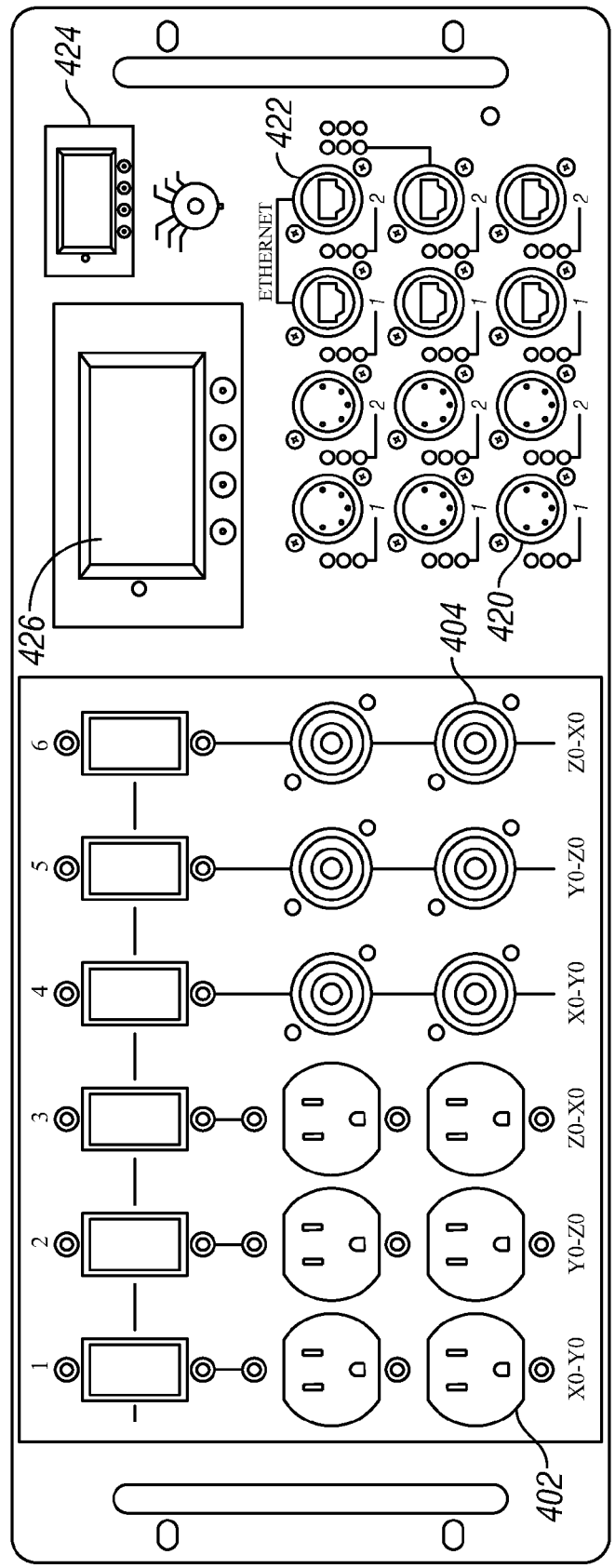
FIGS. 4 and 5 shows a front of house breakout box.
Figure 5:
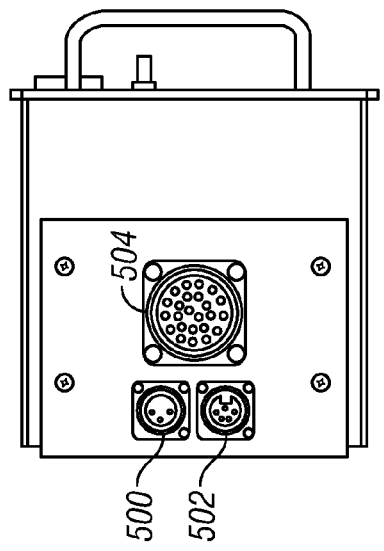

FIGS. 4 and 5 shows a front of house breakout module. In this embodiment, the current breakout module may provide power outlets for 12 devices, each with a separate circuit breaker. In addition, the module provides 10 different DMX connections, each of which allow including console data into the DMX and Ethernet stream. Ethernet inputs 422 can be used for receiving any Ethernet signals from consoles, such as Art-net or Hog Ethernet.

Hence the front of house breakout module allows connection to and powering of multiple different controlling consoles. Each console can be connected to one of the inputs 420, 422, and can be controlled, e.g., to determine a universe for the data from that console.

The control can be carried out using interface controller 424 and its associated display 426 as described herein.

FIG. 5 shows a side view of the breakout module, showing the connector for the trunk that includes power and signal 504. The intercom connection 500 allows connection to the intercom system. This may be an XLR 3 pin connector. An a-b switch connector 502 may also be provided using an XLR 7 pins connector.

The breakout module includes a number of outlets which may include both 115 v outputs such as 402 as well as 208 v outlets 404. This facilitates powering both voltages of consoles that may connect to the module.

Figure 6:
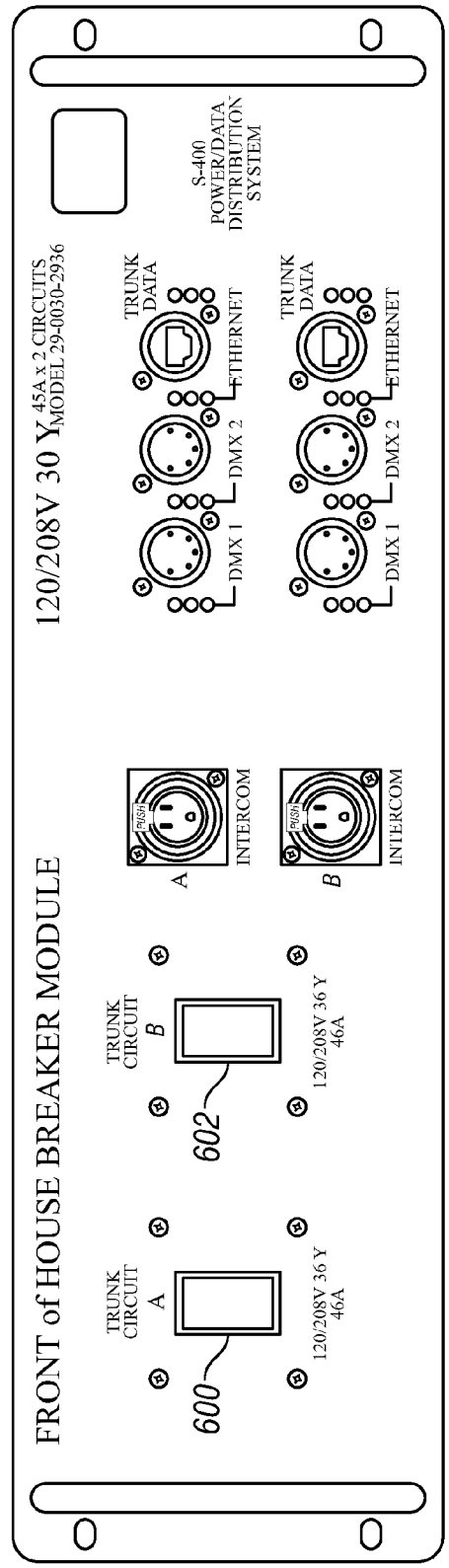
FIG. 6 shows a breaker module.

The front of house breaker module that connects to and provides power for the FOH breakout module, is shown in FIG. 6. This may include only two circuit breakers shown as 600, 602 in FIG. 6. Intercom inputs are also shown as well as DMX connectors and Ethernet connectors.

Figure 7:
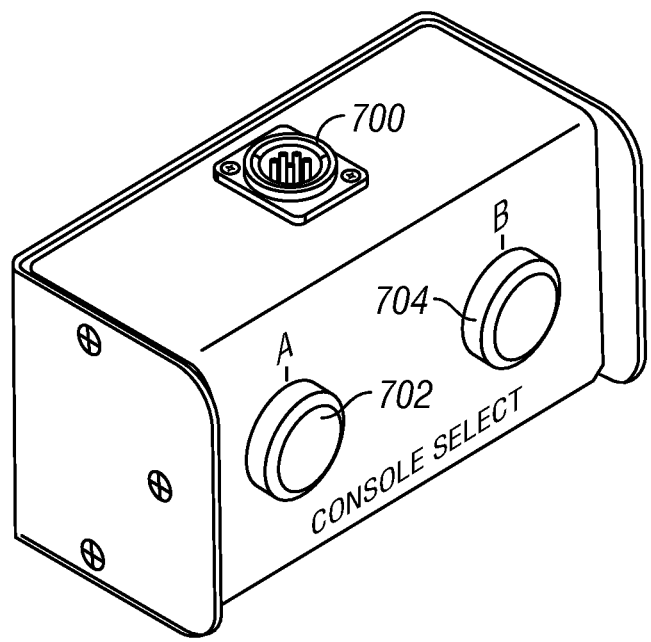
FIG. 7 shows an A/B switch.

Front of house AB switch is shown in FIG. 7. This allows switching between two DMX universes, labeled A and B. The switches can be pressed to select sets of universes, and when pressed, cause the associated lamp to light. The selected universe becomes the default universe for a new connection or for monitoring. FIG. 7 illustrates the XLR connector 700, as well as universe A selector 702 and universe B connector 704. Universe C can be controlled/selected by pressing both the A and B buttons at the same time. In the embodiment, universe C is reserved for system testing and hence may not be selectable at the AB selector.

As an example of operation, two universes from a primary console could be input into the front of house breakout module. These two universes are labeled as 0a and 1a. The 0 and 1 represent the universe, and the "a" designation represents the specific console that is connected.

Two mirrored universes could be added from a backup console. These mirrored universes are labeled 0b and 1b, 0 and 1 for the universe designation, and b for the backup console. Universes from both consoles are active on the network all the time. This makes it possible to verify that both consoles are running by simply checking the system status. The third system C may be used for additional inputs such as a tech console.

The AV switch, which is in fact a virtual switch and not a real switch, indicates the current system state using its backlit selector switches even if this has been changed elsewhere.

The breaker modules and racks can accept a number of different kinds of inputs, and can route them to various outputs using the user interface and the menu display. For example, this accepts Ethernet, DMX 512 as well as DMX 512 over Ethernet. Each of these protocols can be handled simultaneously. Different systems can also be used, where each input from each system may be individually numbered, e.g., A, B, and C, depending on the system that sends it. Therefore, there may be multiple different consoles each connected to a specified universe. For example, with three consoles each connected to universe 0, console A is labeled universe 0a, console B is universe 0B, etc. Any of the consoles can be selected as a default at any moment.

Figure 8:
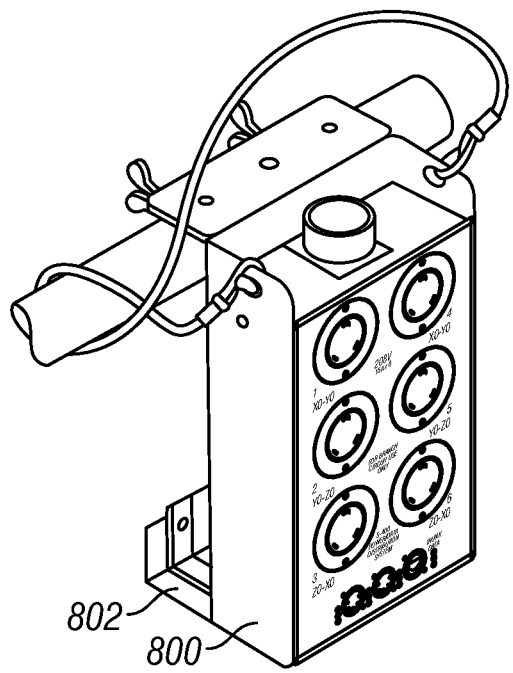
FIGS. 8-11 show mounting of the breakout box.
Figure 9:
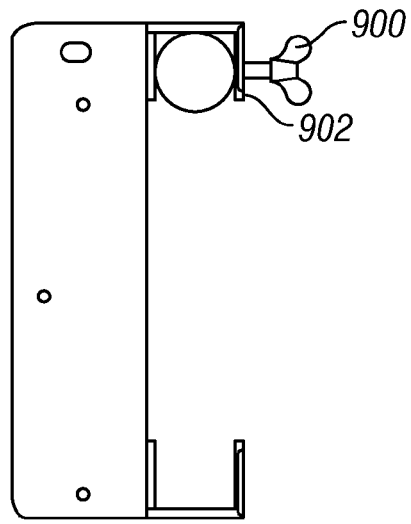
Figure 10:
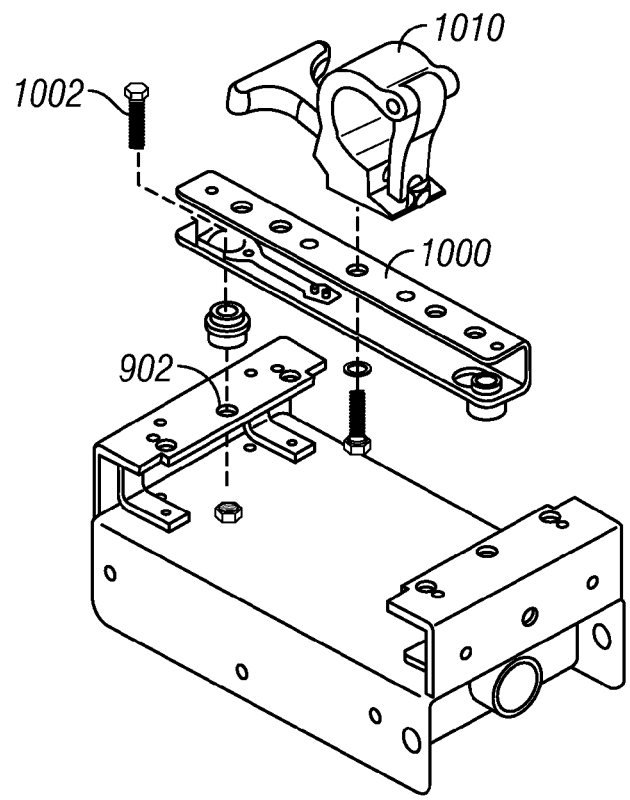
Figure 11:
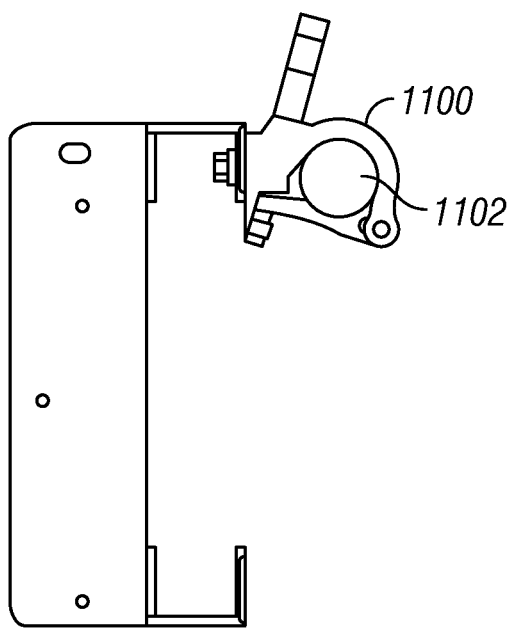

The breakout box can be mounted in one of several different ways. FIG. 8 illustrates a breakout box that is mounted to a truss pipe. The box 800 is connected to at least one piece of angled steel. The angled steel piece 802 has wing bolts 900 thereon as shown in FIG. 9 which can be tightened within the holes, to mount the breakout box onto a truss pipe. Those same holes can be used to hold the angled steel pieces to a connection bracket 1000. FIG. 10 illustrates how the bracket 1000 is connected by screws 1002 into the same holes 902. A truss hook 1100 can be connected to the bracket 1000. Once connected in this way, the trust hook 1100 can be used to connect to a truss pipe 1102 as illustrated in FIG. 11 to hold the breakout unit.

The menu display 205 on the data system can used to configure, test and access the internal status information. The button bar soft programmable buttons 260 as shown in FIG. 2, and can be used with a dynamic menu options. The hard reset button 265 forces a hard reset of the module's processor starting over the operation from an initial state.

Figure 12:
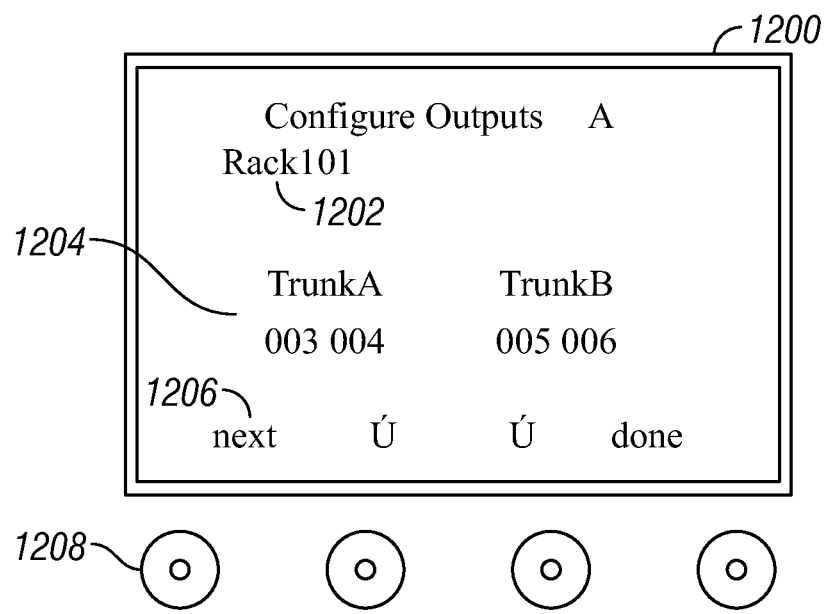
FIG. 12 shows a menu.

FIG. 12 illustrates an exemplary output on the menu. The top line 1200 of the menu provides the title of the specific menu being displayed. This title may change as different items are displayed. The center section provides menu specific information such as the rack number 1202, and the trunk assignments 1204. 1206 illustrates the current function of these buttons. For example in the FIG. 12 display, the button left 1208 is assigned to next. These button functions may be dynamically re-assigned during operation.

Exemplary menus that can be displayed on the unit may include:
  Input/Output Summary
    in—Configure Inputs
    out—Configure Outputs
    src—Configure system input source
    sys—System Overview
      univ—System:Universes
      rack—System:Racks
      foh—System:FOH
  setup—Setup
  dmx—DMX Monitor
  err—Error Status *
  info—Software Info Hence, this can be used to configure the inputs or outputs, or input source, review the system overview, and can each individually select and change parameters.

Different menus may have different functions. The input output summary menu shows the configuration of the DMX rack inputs and the DMX outputs on each of the trunk breakout boxes.

FIG. 13A shows for rack 101 that input 1 is universe 1, from system a (001a) and that input 2 is universe 2 from system b (002b)

The source default is system a, as shown by the last line of the input summary which shows SRC: a.

Similarly, the front of house module can have an I/O summary as shown in FIG. 13B.

This shows the configuration of the 10 DMX 512 rack inputs, and the two outputs 000 and 001. Each input universe has a letter which indicates which of the three sources is being used for that universe. For example, 001a indicates that universe 1 is associated with source a. Again, source a is the current default in this picture.

Figure 13C:
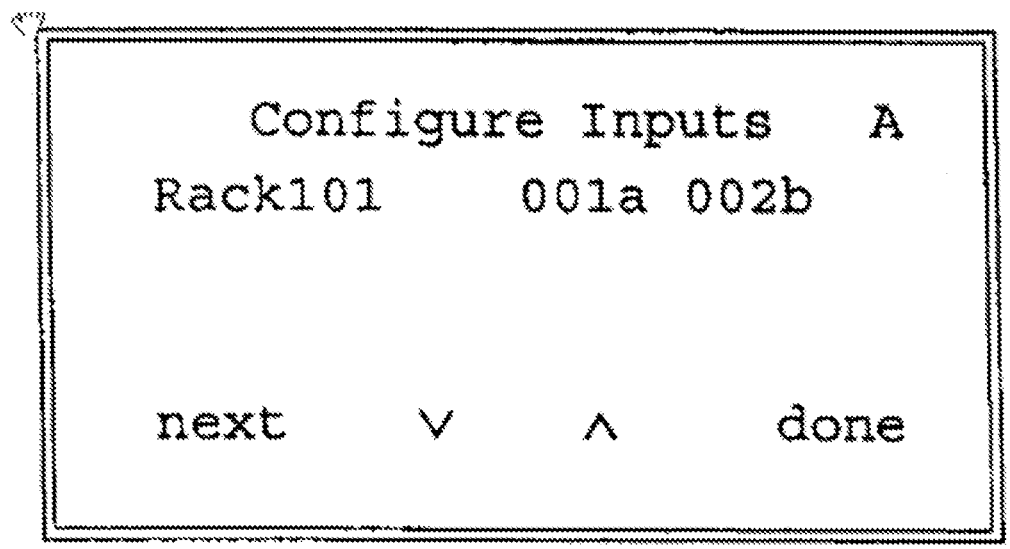

The rack inputs have a menu shown in FIG. 13C.

Figure 13D:
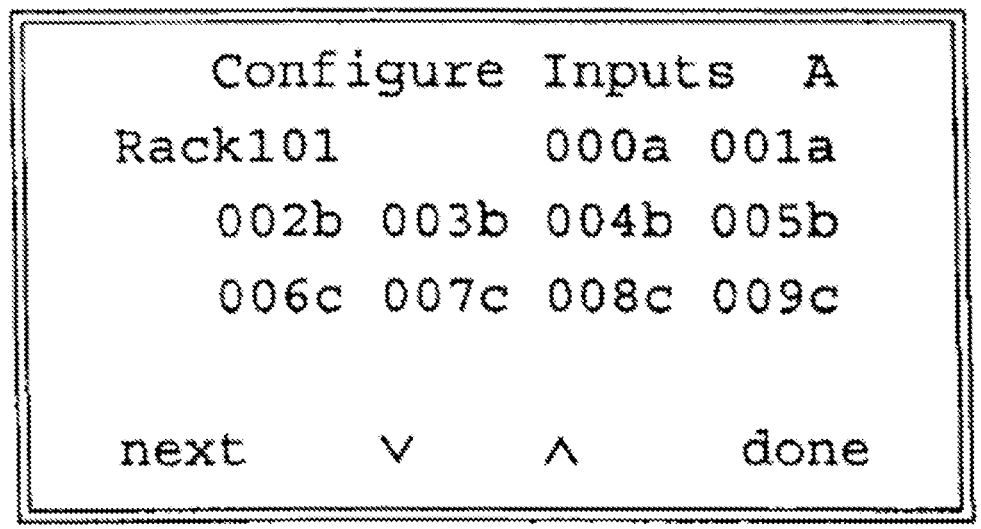

That can be configured by highlighting the universe and selecting either the up menu or the down menu. When finished, "done" can be pressed to confirm that a proper operation is completed. In a similar way, the front of house inputs can be configured as shown in FIG. 13D.

Figure 13E:
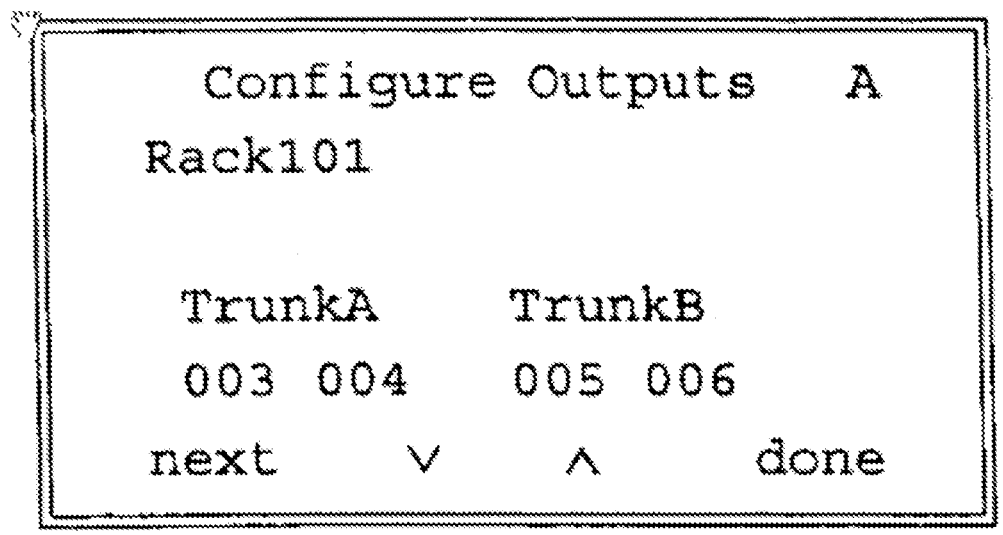

And the rack inputs can be configured as shown in FIG. 13E

Figure 13F:
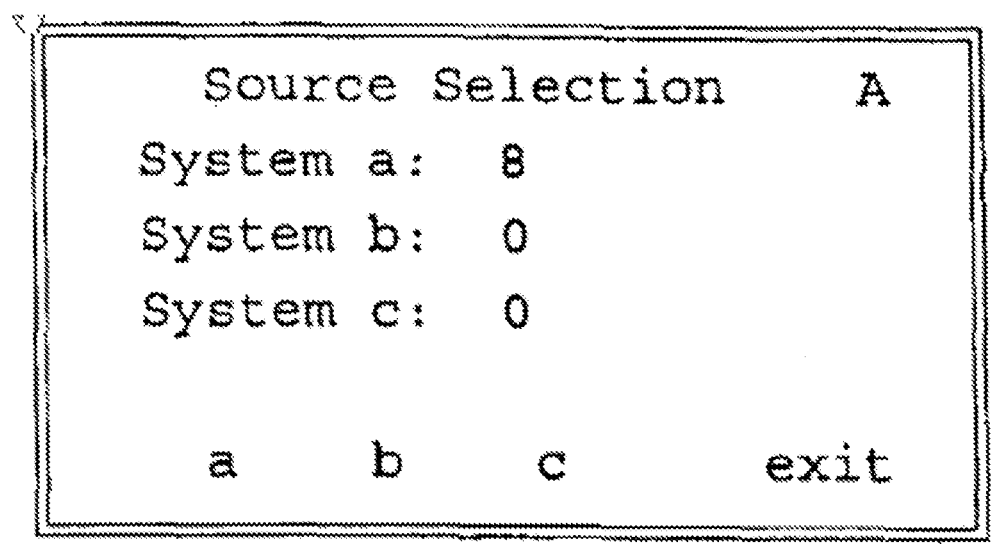

Source selection shows the number of modules on the network that are currently using each input system as its default. A highlighted source is the current source for the module, which can be changed by selecting a, b or c from the last row of the menu as shown in FIG. 13F.

A system overview screen is shown in FIG. 13G is also provided, where the universe field shows the number of DMX 512 currently active, the rack interface field shows the number of rack interface modules on the network, and the front of house interface field shows the number of front of house modules on the network.

The system universes display shows the universes that are active on the network as shown in FIG. 13H.

Up to four universes can be displayed at any one time. Each display shows the universe number (here 0000), and the source (here b), the module where that universe is defined as an input (here rack 250) and the port for that input to be connected (here port zero). The left and right arrows allow different universes to be displayed.

Different operations can also be carried out in an analogous way, including defining system racks and front of house, defining the name display configuration reset and light options.

Figure 13I:
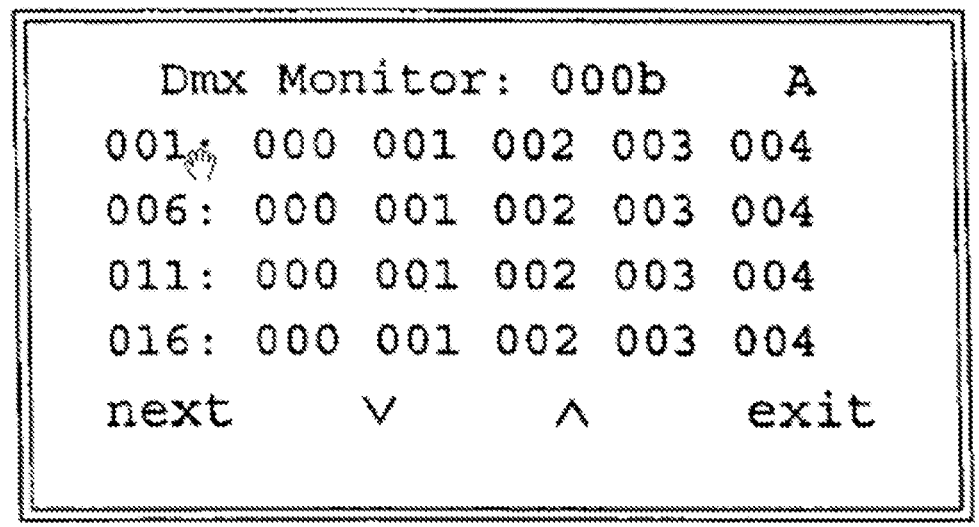

The DMX monitors shows the current data for a DMX universe as shown in FIG. 13I.

The DMX universe number is shown in the title here 000b. The "next" key triggers to the next universe. The first number of each line is the channel offset, followed by the five channels of data.

According to an embodiment, each of the DMX inputs receive a system identifier which is a letter a, b or c, in addition to a universe number which can be in this embodiment between 0 and 255. The input receives system and universe, but the output only has a universe number; thereby enabling control by whatever hardware is selected as active to create and control that universe. Each DMX output transmits its assigned universe for the currently active system.

The active system can be selected from the AB switch box or from any menu. The AB switch can be connected to any desired breakout box anywhere in the system, since it is a logical, not physical switch.

An advantage of this system is that it enables multiple universes to be controlled from multiple different consoles. For example, two universes can be controlled from the primary console into the front of house breakout box. These two universes can be labeled as 0a and 1a. Two other mirrored universes can be used from the backup console labeled 0b and 1b. Since the universe numbers on these are the same, they both carry the same universe of information. However, the system information is different. All universes are active at all times. When system a is selected, console a controls the universe by sending universes 0a and 1a; while system b is controllable via the switch to allows sending universes 0b and 1b.

Although only a few embodiments have been disclosed in detail above, other embodiments are possible and the inventors intend these to be encompassed within this specification. The specification describes specific examples to accomplish a more general goal that may be accomplished in another way. This disclosure is intended to be exemplary, and the claims are intended to cover any modification or alternative which might be predictable to a person having ordinary skill in the art. For example, other commands and command forms can be used. DMX is listed as the preferred command format, but any other format, and specifically any time-division multiplexed format could be used for this control.

Also, the inventors intend that only those claims which use the words "means for" are intended to be interpreted under 35 USC 112, sixth paragraph. Moreover, no limitations from the specification are intended to be read into any claims, unless those limitations are expressly included in the claims. The computers described herein may be any kind of computer, either general purpose, or some specific purpose computer such as a workstation. The computer may be a Pentium class computer, running Windows XP or Linux, or may be a Macintosh computer. The computer may also be a handheld computer, such as a PDA, cellphone, or laptop.

The programs may be written in C, or Java, Brew or any other programming language. The programs may be resident on a storage medium, e.g., magnetic or optical, e.g. the computer hard drive, a removable disk or media such as a memory stick or SD media, or other removable medium. The programs may also be run over a network, for example, with a server or other machine sending signals to the local machine, which allows the local machine to carry out the operations described herein.

What is claimed is:

1. A device that controls multiple remote devices, including at least one lighting device, comprising:
   a distribution panel, including power connectors, including electric power for different devices, control connections for DMX universes and Ethernet connections, said DMX universes allowing connection of plural different DMX universes from said devices;
   at least one output, outputting control information from said control connections to one of said multiple devices;
   a control interface for said control connections, including at least one interface that allows configuring which of a plurality of different connected devices is controlling a specific universe;
   a selector, remote from said distribution panel, which allows selecting which of said plurality of different connected devices is controlling said universe; and
   a controller box, remote from said distribution panel, said controller box including plural different circuit breakers therein and at least one electrical power outlet, and a safety mechanism which prevents power from being supplied by said electrical power outlet until said controller box is properly connected.

2. The device as in claim 1, further comprising a connection for an intercom on said controller box.

3. The device as in claim 1, wherein said Ethernet connections include information from the DMX universes therein.

4. The device as in claim 1, wherein said Ethernet connections receive controlling information for at least one of said connected devices.

5. A power distribution device, comprising:
   a first distribution part, located in a rack that has an electrical power distribution therein, that has inputs from at least first and second controlling consoles for a plurality of controlled lights to be controlled from said controlling consoles, having outputs to control said plurality of controlled lights, and having electrical power outlets for powering said first and second controlling consoles;
   a second distribution part, also located in said rack, also receiving power from said rack, receiving said outputs, and having a connection to a remote power distribution unit, said remote power distribution unit including at least one electrical outlet for powering at least one of said plurality of controlled lights, and at least one output associated with said inputs, for providing control of said plurality of controlled light that receives power on said remote power distribution unit.

6. A power distribution device as in claim 5, wherein said inputs from at least first and second controlling consoles include both Ethernet and DMX inputs, either of which is configurable to control said plurality of controlled lights.

7. A power distribution device as in claim 5, further comprising a selector, in a separate housing, that allows selecting which of said controlling consoles controls said plurality of controlled lights.

8. A power distribution device as in claim 5, further comprising a selector, in a separate housing, that allows selecting which of said controlling consoles controls said plurality of controlled lights.

9. A power distribution device as in claim 8, wherein said selector can be connected to said first distribution part or to said power distribution unit and can control said selecting from both said first distribution part in a first mode and from said second distribution part in a second mode.

10. A power distribution device as in claim 8, wherein said selector includes an illumination indicating which of said controlling consoles is controlling 666said plurality of controlled lights.

11. A control distribution device, comprising:
   a first distribution part, located in a first housing which is within a rack, said first distribution part having a panel that has both DMX inputs and Ethernet inputs, said DMX inputs and Ethernet inputs receiving inputs from at least first and second controlling consoles for a plurality of lights to be controlled from said consoles, having outputs to control said plurality of lights, said outputs based on a selectable one of said DMX inputs and Ethernet inputs from one of the at least first and second controlling consoles; and a selector, in a second housing separate from the first housing, said selector to select which of said controlling consoles controls said plurality of lights among said first controlling console that is connected to said DMX inputs and said second controlling console that is connected to said Ethernet inputs, wherein said first housing is in a rack, said rack has an electrical power distribution therein and having electrical power outlets for powering said first and second controlling consoles, wherein said rack has a second distribution part, also located in said rack, also receiving power from said rack, receiving said outputs, and having a connection to a remote power distribution unit, said remote power distribution unit including at least one electrical outlet for powering one of said plurality of lights, and at least one output associated with said inputs, for providing control of said plurality of lights that receives power on said remote power distribution unit.

12. A power distribution device as in claim 11, wherein said selector can be connected to said first distribution part or to said power distribution unit and can control said selecting from both said first distribution part in a first mode and from said power distribution part in a second mode.

13. A power distribution device as in claim 12, wherein said selector includes an illumination indicating which of said controlling consoles is controlling said lights.

14. A method comprising:

providing a first universe of control information from a first controlling console connected to a DMX connector, said control information of said first universe to control plural different controlled elements including at least one controlled light;

providing a second universe of control information from a second controlling console connected to an Ethernet connector, said control information of said second universe to control said plural different controlled elements including said at least one controlled light;

allowing selection of either said first controlling console or said second controlling console to provide said first universe of information to said plural different controlled elements, wherein said allowing selection is controllable from a rack that holds said DMX connector and said Ethernet connector in a first selection mode, and from a remote box in a second selection mode; and distributing said first universe of control information over a same rack of equipment that also distributes electrical power via a remote box, to said controlled elements including said at least one controlled light, wherein said distributing comprises providing a circuit breaker in said rack that controls power distribution to said box, and another circuit breaker that controls power to another box, and wherein said selection can be carried out from said remote box.

15. A method as in claim 14, wherein said rack and said remote box each includes a connection for a third controlling console for said first universe.

16. A method as in claim 14, wherein at least one of said Ethernet connections also carries information from said DMX information.

* * * * *